United States Patent [19]
Chien et al.

[11] Patent Number: 5,510,279
[45] Date of Patent: Apr. 23, 1996

[54] METHOD OF FABRICATING AN ASYMMETRIC LIGHTLY DOPED DRAIN TRANSISTOR DEVICE

[75] Inventors: Sun-Chieh Chien, Hsinchu; Jengping Lin, Taoyuan Hsien; Chen-Chiu Hsue, Hsinchu, all of Taiwan

[73] Assignee: United Microelectronics Corp., Hsinchu, Taiwan

[21] Appl. No.: 369,728

[22] Filed: Jan. 6, 1995

[51] Int. Cl.$^6$ .............................................. H01L 21/8234
[52] U.S. Cl. ................... 437/41; 437/35; 437/40
[58] Field of Search ............ 437/41 AS, 41 RLD, 437/40 AS, 44, 35, 913, 27, 29

[56] References Cited

U.S. PATENT DOCUMENTS

| H986 | 11/1991 | Codella et al. | 437/41 AS |
|---|---|---|---|
| 5,210,044 | 5/1993 | Yoshikawa | 437/44 |
| 5,316,961 | 5/1994 | Okazawa | 437/35 |
| 5,366,915 | 11/1994 | Kodama | 437/35 |
| 5,371,394 | 12/1994 | Ma et al. | 437/44 |
| 5,376,566 | 12/1994 | Gonzalez | 437/35 |

FOREIGN PATENT DOCUMENTS

| 4112072 | 10/1991 | Germany | 437 AS/40 AS |
|---|---|---|---|
| 59-61185 | 4/1984 | Japan | 437/35 |
| 59-124164 | 7/1984 | Japan | 437/44 |
| 63-40374 | 2/1988 | Japan | 437/44 |

Primary Examiner—Tom Thomas
Assistant Examiner—Michael Trinh
Attorney, Agent, or Firm—Ladas & Parry

[57] ABSTRACT

A method of fabricating an asymmetric lightly doped drain transistor device. The device's drain region is shielded with a barrier layer when ion implantation is applied to a implant a highly doped source region. A large angle implantation then follows to form a lightly doped pocket region adjacent to the highly doped source region. The implantation forming the pocket region increases the doping concentration along the device's source side which increases the device's threshold voltage diminishing short channel effects.

9 Claims, 5 Drawing Sheets

5,510,279

METHOD OF FABRICATING AN ASYMMETRIC LIGHTLY DOPED DRAIN TRANSISTOR DEVICE

FIELD OF THE INVENTION

The invention relates in general to a method of fabricating an asymmetric lightly doped drain transistor device.

BACKGROUND OF THE INVENTION

With the continuous trend towards the miniaturization of semiconductor devices, many problems arise. For example, the electrical field in the channel region increases with the shortening of the length of the channel region. This increased electrical field, which has a rather high energy, makes the carriers at the junction of drain region and channel region, that is, the carriers at the highest electrical field, travel through a gate oxide layer and get trapped in a gate electrode. The trapped carriers will cause gate leakage current which can adversely influence the reliability of the device. This so-called "hot electron effect" has become a serious problem encountered in the scaling down of VLSI devices.

On the other hand, the shrinking of the channel length increases the probability of encountering coupling between the depletion region of source-substrate junction and that of drain-substrate junction in the substrate. The coupling of the depletion regions is the so-called "punchthrough effect" and severely limits the normal operation range of a MOS device. The punchthrough effect, which is one of the short channel effects, is much more significant in a lightly-doped drain (LDD) MOS device, since the junctions between its lightly-doped regions and substrate have wider depletion regions that extend into the channel region in the substrate.

A fabrication process for making lightly-doped drain and source regions for ICs has been proposed. Its process steps in its various stages are shown in the cross-sectional views in FIGS. 1A to 1C.

Referring to FIG. 1A, a gate oxide layer 12 and a gate electrode 14 are first formed in sequence on a P-type silicon substrate 10. Then, a first ion implantation to implant N-type ions is applied to form lightly-doped source/drain regions 16 at the two sides of gate electrode 14.

Referring next to FIG. 1B, sidewall spacers 18 are formed on each side wall of gate electrode 14 by, for example, depositing a layer of oxide and then etching back by plasma etching. A second ion implantation is applied to implant N-type ions, forming heavily-doped source/drain regions 19. Because sidewall spacers 18 obstruct the impurities from entering into lightly-doped regions 16 during this second implantation process, the implantation concentration in regions 16 remain relatively light as compared to that in regions 19.

The structure of FIG. 1B is then subjected to an annealing process to activate the implanted impurities. The resulting structure is shown in FIG. 1C, in which due to the activation, the edges, as indicated by numeral 15, of the lightly-doped regions 16 extend slightly inside the channel region.

A PMOS device can similarly be prepared from an N-type substrate by the above conventional process. A final structure of this PMOS device is shown in FIG. 1D.

The above proposed LDD transistor device utilizes lightly-doped regions 16 to shift the high energy electrical field region away from the channel region to reduce the possibility of the electrons traveling through the gate oxide layer. Lowering the highest electrical field in the channel region and concurrently changing the location of the peak value thereof, will diminish the "hot electron effect". However, in spite of the short channel effects such as the punchthrough effect, as the lightly-doped source/drain regions underneath spacers 18 have high sheet-resistance and therefore the conventional LDD transistor devices have lower saturation current, the electrical performance of the device in practical applications, such as driving ability and transition speed, becomes unsatisfactory. Moreover, the threshold voltage of such conventional lightly-doped drain transistor devices is also not satisfactory.

Therefore a need still exists for ways to effectively overcome both short channel and hot electron effects without degradation in device performance.

SUMMARY OF THE INVENTION

It is therefore an object of this application to provide a method of fabricating an asymmetric lightly-doped drain transistor device having reduced sheet resistance and raised saturation current.

It is another object of this application to provide a method for fabricating a lightly-doped drain transistor device which increases the threshold voltage and diminishes both short channel and hot electron effects of the conventional lightly-doped drain transistor device.

Specifically, the methodology of the invention is as follows. A silicon substrate doped with impurities of a first conductivity type and having an active region is provided. A gate oxide layer is formed on the active region. A gate structure is formed on the gate oxide layer to form a channel region there beneath in the substrate. A first ion implantation is applied to implant ions of a second conductivity type into the substrate to form lightly doped source/drain regions at the two sides of said channel region. A barrier layer is formed on the drain region. A second ion implantation is applied to implant ions of a second conductivity type into the substrate to form a heavily doped source region. A large angle ion implantation is applied to implant ions of a first conductivity type into the substrate to form a lightly doped pocket region under the channel region and at the source side. The barrier layer is removed and sidewall spacers are formed on side walls of the gate structure. A third ion implantation is applied to implant ions of a second conductivity type into the substrate to form heavily doped source/drain regions.

The above methodology attains the objects of the invention by forming an asymmetric structure of a lightly-doped drain device with a lightly-doped pocket region at the source side. The asymmetric structure is obtained by forming a barrier layer on the lightly-doped drain region, followed by implanting the same type ions into the lightly-doped source region to fabricate a heavily-doped region. The source side implant reduces the sheet resistance at the source side and increases the saturation current ($Id_{sat}$). The lightly-doped pocket region at the source side is obtained by applying a large angle ion implantation to implant ions of a different type into the substrate at the source side. The implant forming the pocket region increases the doping concentration along the source side under the channel region, which increases the threshold voltage and improves upon the short channel effect.

Other objects, features and advantages of the present invention will become apparent upon consideration of the specification and the appended drawings.

DETAILED DESCRIPTION OF THE INVENTION

Figure 1A:
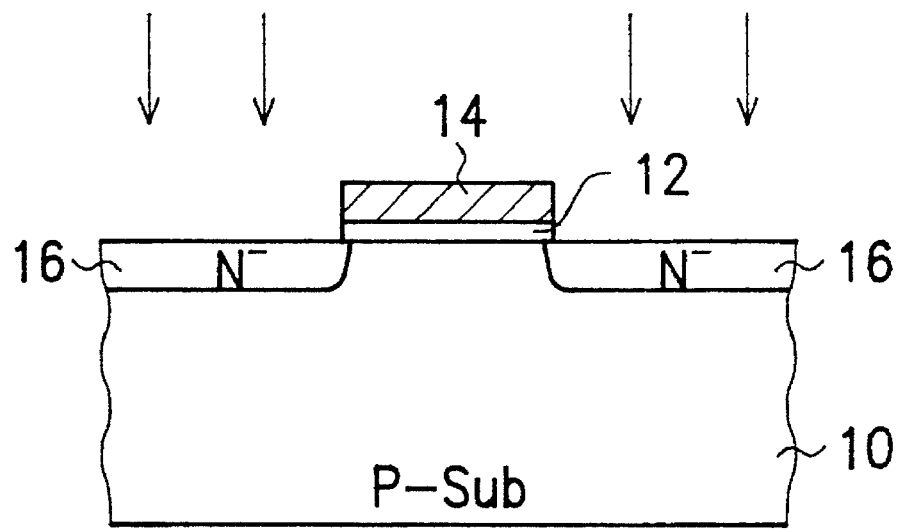
FIGS. 1A–1C show in cross-sectional views the conventional method of fabricating an N-type lightly-doped drain transistor device.
Figure 1B:
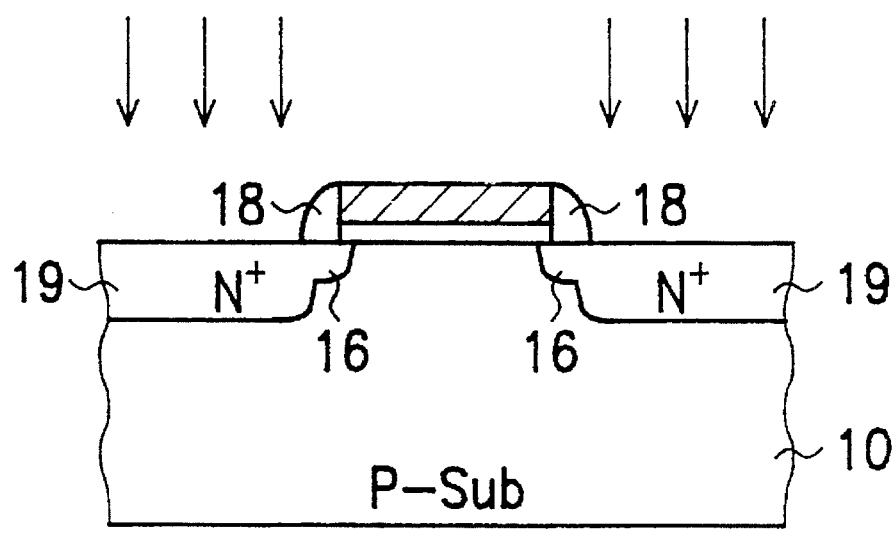
Figure 1C:
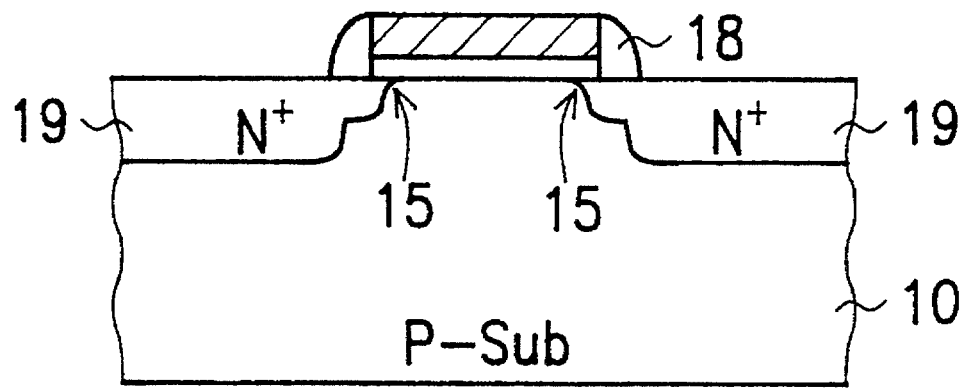
Figure 1D:
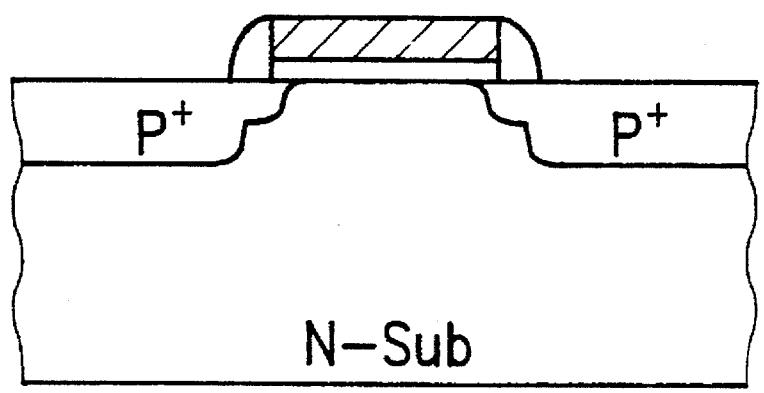
FIG. 1D shows in cross-sectional views a P-type lightly-doped drain transistor device fabricated by the conventional method.
Figure 2A:
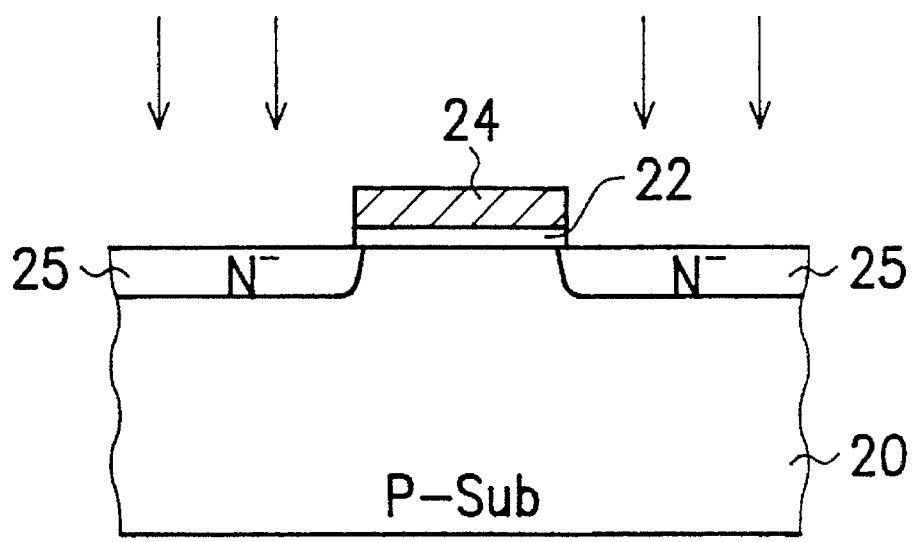
FIGS. 2A–2D show in cross-sectional views the method of fabricating an asymmetric lightly-doped drain transistor device in accordance with a first embodiment of the present invention.

Referring to FIG. 2A, an active region (not shown) is formed on a P-type substrate 20, and subsequently a gate oxide layer 22 is formed in the active region. A conducting layer is then deposited over the active region, and is patterned and etched to form a gate structure 24. The material used for forming the conducting layer is polysilicon. Ion implantation is then applied to implant N-type impurities into substrate 20 to form N-type source/drain regions 25.

Figure 2B:
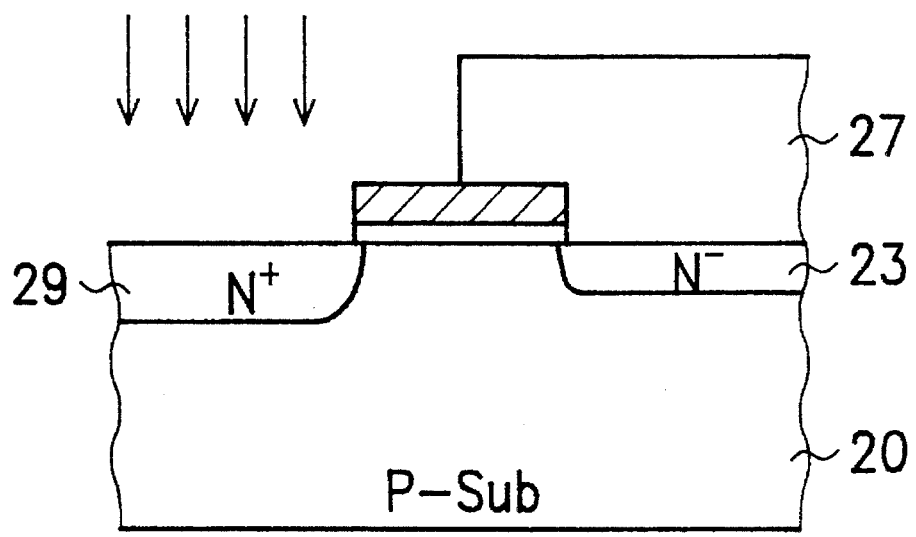

Referring to FIG. 2B, on the top of a drain region 23 is then formed a barrier layer 27 made of photoresist. Next, another ion implantation to implant N-type impurities is applied to substrate 20 to make source region 25 become an N-type heavily-doped region 29. The implantation can be performed, for example, by implanting arsenic ions ($As^+$) with an implanting energy ranging from 50 to 100 KeV and an implanting dosage of $5E14/cm^2$ to $2E15/cm^2$. The resultant structure is shown in FIG. 2B.

Figure 2C:
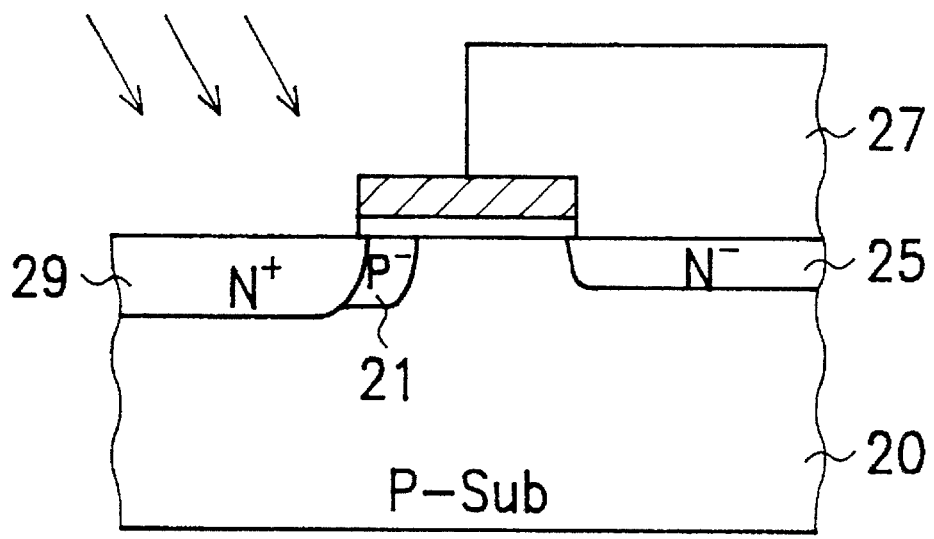

Referring now to FIG. 2C, a large angle ion implantation is then applied to implant boron ions ($B_{11}^+$) into substrate 20 to form a lightly-doped pocket region 21 under the gate electrode 24 and adjacent to the heavily-doped region 29. The implantation is carried out by using an implanting energy of 40 to 70 KeV and an implanting dosage of $2E12/cm^2$ to $2E13/cm^2$ at a 15–45 degree tilted.

Figure 2D:
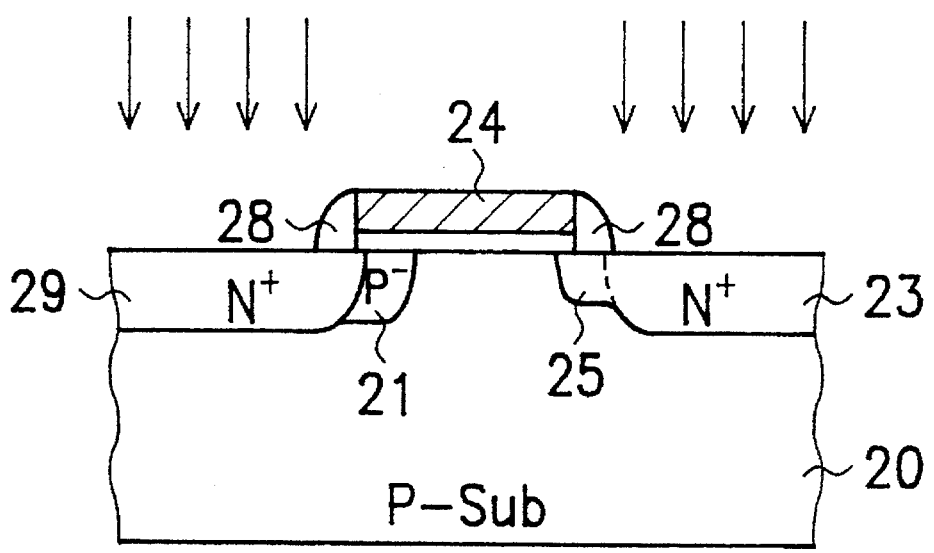

After the barrier layer 27 is removed, the structure as shown in FIG. 2c is then deposited to form an insulating layer, i.e., an oxide layer, followed by an etching back process to form side wall spacers 28 on the sidewalls of the gate electrode 24. Thereafter, N-type impurities are implanted into the substrate 20 to form a heavily-doped region 23 in the region not obstructed by the spacers 28 and a lightly-doped region 25 underneath the spacers 28 to finish the process. The finished structure as shown in FIG. 2D is an N-type asymmetric lightly-doped drain transistor device.

Figure 3:
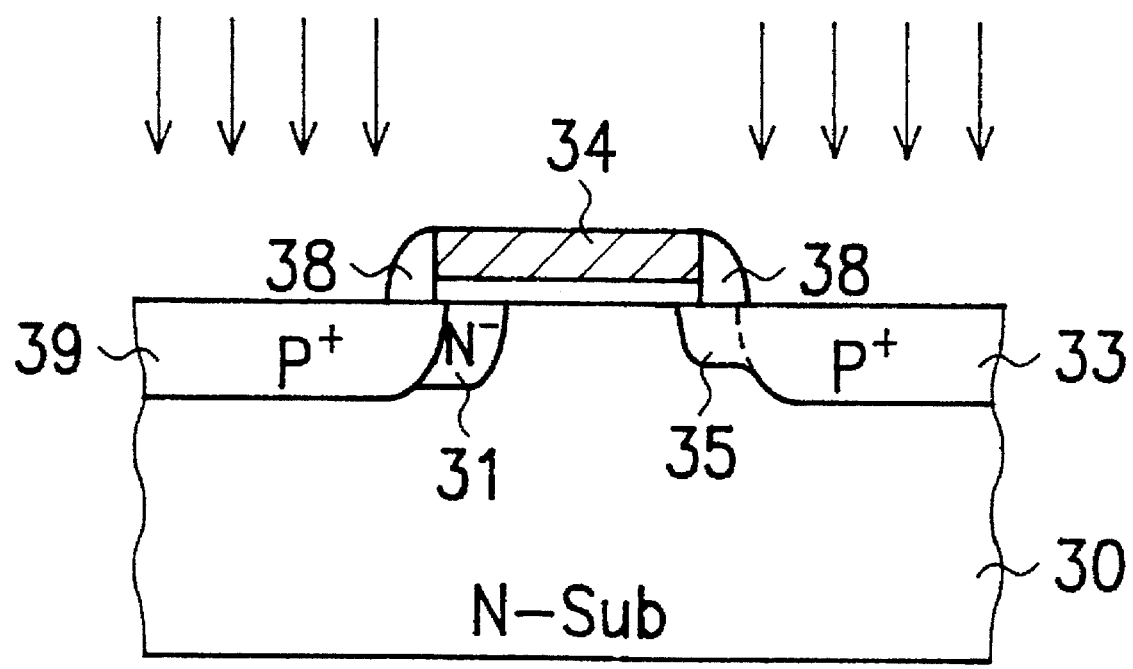
FIG. 3 shows in cross-sectional view an asymmetric lightly-doped drain transistor device fabricated in accordance with a second embodiment of the present invention.

Similar process steps can be applied to an n-type substrate to fabricate a P-type asymmetric lightly-doped drain transistor device of the present invention. The resulting P-type asymmetric lightly-doped drain transistor device is shown in FIG. 3. Side wall spacers 38 are formed on the sidewalls of a gate electrode 34. P-type ions, for example, $BF_2^+$ ions are implanted into a substrate 30 at an implanting energy of 50 KeV to 100 KeV and an implanting dosage of $5E14/cm^2$ to $2E15/cm^2$. Phosphorus ions ($P_{31}^+$) are implanted into the substrate 30 at an implanting energy of 40 KeV to 100 KeV, an implanting dosage of $5E12/cm^2$ to $3E13/cm^2$, at an angle of 15 to 45 degrees. The resulting device includes a heavily-doped region 33 in the region not obstructed by the spacer 38, a lightly-doped region 35 underneath the spacer 38, a heavily-doped P-type region 39 and a lightly-doped pocket region 31 under the gate electrode 34.

The source region of the asymmetric lightly-doped drain transistor device of the invention, after being implanted with a heavy dosage of ions, can effectively reduce the sheet resistance, and thereby increase the saturation current. Moreover, since the lightly doped pocket region, which occupies a portion of the channel region and is adjacent to the source region, is doped with the same type impurities as the substrate and has higher concentration of impurities, it requires a higher gate electrode potential to form an inversion layer of the channel region. This increases the threshold voltage. A narrow depletion region, owing to having a higher impurity concentration, results, thus preventing the extension of the depletion region into the channel region. The short channel effect is accordingly eliminated.

In addition, since the asymmetric lightly-doped drain transistor device according to the invention has a conventional lightly doped drain structure, which can reduce the high electrical field and change its distribution, such also will help diminish the hot electron effect.

Having described the invention in connection with preferred embodiments, modification may now suggest itself to those skilled in the art. Thus the invention is not to be limited to the described embodiment, except as required by the appended claims.

We claim:

1. A method of fabricating an asymmetric lightly doped drain transistor device, comprising the following steps:

(a) providing a silicon substrate doped with impurities of a first conductivity type and having an active region;

(b) forming a gate oxide layer on said active region;

(c) forming a gate structure on said gate oxide layer to form a channel region there beneath in said substrate;

(d) applying a first ion implantation to implant ions of a second conductivity type into said substrate to form doped source and drain regions at two sides of said channel region;

(e) forming a barrier layer on said drain region;

(f) applying a second ion implantation to implant a second conductivity type into said substrate to form a heavily doped first source region, using said barrier layer as a mask;

(g) applying an oblique angle ion implantation to ions of a first conductivity type into said substrate to form a lightly doped pocket region under said channel region and at side of said heavily doped first source region, using said barrier layer as a mask;

(h) removing said barrier layer and forming sidewall spacers on side walls of said gate structure; and (i) applying a third ion implantation to implant ions of a second conductivity type into said substrate to form a heavily doped second source region and a heavily doped drain region, using said sidewall spacers as a mask.

2. The method as claimed in claim 1, wherein said first conductivity type is P-type, said second conductivity type is N-type, and said lightly doped pocket region is P-type.

3. The method as claimed in claim 2, wherein said second ion implantation is carried out by implanting As ions with a dosage of $5E14/cm^2$ to $2E15/cm^2$ and an implanting energy of 50 KeV to 100 KeV.

4. The method as claimed in claim 3, wherein said oblique angle ion implantation is carried out by implanting boron ions with a dosage of $2E12/cm^2$ to $2E13/cm^2$, 15–45 degree tilted, and an implanting energy of 40 KeV to 100 KeV.

5. The method as claimed in claim 1, wherein said first conductivity type is N-type, said second conductivity type is P-type, and said lightly doped pocket region is N-type.

6. The method as claimed in claim 5, wherein said second ion implantation is carried cut by implanting $BF_2$ ions with a dosage of $5E14/cm^2$ to $2E15/cm^2$ and an implanting energy of 50 KeV to 100 KeV.

7. The method as claimed in claim 6, wherein said oblique angle ion implantation is carried out by implanting phosphorus ions with a dosage of $5E12/cm^2$ to $3E13/cm^2$, 15–45 degree tilted, and an implanting energy of 40 KeV to 100 KeV.

8. The method as claimed in claim 1, wherein said gate structure is formed of polysilicon.

9. The method as claimed in claim 1, wherein said barrier layer is a photoresist.

* * * * *